United States Patent
Chien et al.

(10) Patent No.: US 11,705,496 B2
(45) Date of Patent: Jul. 18, 2023

(54) CHARGE-TRAPPING LAYER WITH OPTIMIZED NUMBER OF CHARGE-TRAPPING SITES FOR FAST PROGRAM AND ERASE OF A MEMORY CELL IN A 3-DIMENSIONAL NOR MEMORY STRING ARRAY

(71) Applicant: SUNRISE MEMORY CORPORATION, San Jose, CA (US)

(72) Inventors: Wu-Yi Henry Chien, San Jose, CA (US); Scott Brad Herner, Portland, OR (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 17/222,082

(22) Filed: Apr. 5, 2021

(65) Prior Publication Data

US 2021/0320182 A1  Oct. 14, 2021

Related U.S. Application Data

(60) Provisional application No. 63/007,244, filed on Apr. 8, 2020.

(51) Int. Cl.
*H01L 29/423* (2006.01)
*H01L 29/792* (2006.01)
(Continued)

(52) U.S. Cl.
CPC .. *H01L 29/42348* (2013.01); *H01L 29/78642* (2013.01); *H01L 29/78672* (2013.01); *H01L 29/7926* (2013.01); *H10B 43/30* (2023.02)

(58) Field of Classification Search
CPC ......... H01L 29/42348; H01L 27/11568; H01L 29/78642; H01L 29/78672; H01L 29/7926
See application file for complete search history.

(56) References Cited

U.S. PATENT DOCUMENTS

| 4,213,139 A | 7/1980 | Rao |
| 5,583,808 A | 12/1996 | Brahmbhatt |

(Continued)

FOREIGN PATENT DOCUMENTS

| JP | 2000339978 A | 12/2000 |
| JP | 2006099827 A1 | 4/2006 |

(Continued)

OTHER PUBLICATIONS

"PCT Search Report and Written Opinion, PCT/US2021/025722", dated Jun. 15, 2021, 10 pages.

(Continued)

*Primary Examiner* — Mohammed R Alam
(74) *Attorney, Agent, or Firm* — Edward C. Kwok; VLP Law Group LLP

(57) ABSTRACT

A thin-film memory transistor includes a source region, a drain region, a channel region, a gate electrode, and a charge-trapping layer provided between the channel region and the gate electrode and electrically isolated therefrom, wherein the charge-trapping layer has includes a number of charge-trapping sites that is 70% occupied or evacuated using a single voltage pulse of a predetermined width of 500 nanoseconds or less and a magnitude of 15.0 volts or less. The charge-trapping layer comprises silicon-rich nitride may have a refractive index of 2.05 or greater or comprises nano-crystals of germanium (Ge), zirconium oxide (ZrO$_2$), or zinc oxide (ZnO). The thin-film memory transistor may be implemented, for example, in a 3-dimensional array of NOR memory strings formed above a planar surface of a semiconductor substrate.

8 Claims, 3 Drawing Sheets

(51) Int. Cl.
  *H01L 29/786* (2006.01)
  *H10B 43/30* (2023.01)

(56) References Cited

U.S. PATENT DOCUMENTS

| | | |
|---|---|---|
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,880,993 A | 3/1999 | Kramer et al. |
| 5,915,167 A | 6/1999 | Leedy |
| 6,040,605 A | 3/2000 | Sano et al. |
| 6,107,133 A | 8/2000 | Furukawa et al. |
| 6,118,171 A | 9/2000 | Davies et al. |
| 6,130,838 A | 10/2000 | Kim et al. |
| 6,314,046 B1 | 11/2001 | Kamiya et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,307,308 B2 | 12/2007 | Lee |
| 7,489,002 B2 | 2/2009 | Forbes et al. |
| 7,524,725 B2 | 4/2009 | Chung |
| 7,542,348 B1 | 6/2009 | Kim |
| 7,612,411 B2 | 11/2009 | Walker |
| 8,026,521 B1 | 9/2011 | Or-Bach et al. |
| 8,139,418 B2 | 3/2012 | Carman |
| 8,178,396 B2 | 5/2012 | Sinha et al. |
| 8,395,942 B2 | 3/2013 | Samachisa et al. |
| 8,630,114 B2 | 1/2014 | Lue |
| 8,767,473 B2 | 7/2014 | Shim et al. |
| 8,848,425 B2 | 9/2014 | Schloss |
| 8,878,278 B2 | 11/2014 | Alsmeier et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,412,752 B1 | 8/2016 | Yeh et al. |
| 9,455,268 B2 | 9/2016 | Oh et al. |
| 9,620,605 B2 | 4/2017 | Liang et al. |
| 9,633,944 B2 | 4/2017 | Kim |
| 9,748,172 B2 | 8/2017 | Takaki |
| 9,799,761 B2 | 10/2017 | Or-Bach et al. |
| 9,842,651 B2 | 12/2017 | Harari |
| 9,892,800 B2 | 2/2018 | Harari |
| 9,911,497 B1 | 3/2018 | Harari |
| 10,074,667 B1 | 9/2018 | Higashi |
| 10,096,364 B2 | 10/2018 | Harari |
| 10,121,553 B2 | 11/2018 | Harari |
| 10,249,370 B2 | 4/2019 | Harari |
| 10,254,968 B1 | 4/2019 | Gazit et al. |
| 10,283,493 B1 | 5/2019 | Nishida |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,622,377 B2 | 4/2020 | Harari et al. |
| 10,692,874 B2 | 6/2020 | Harari et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0128815 A1 | 6/2005 | Ishikawa et al. |
| 2005/0218509 A1 | 10/2005 | Kipnis et al. |
| 2005/0280061 A1 | 12/2005 | Lee |
| 2006/0001083 A1 | 1/2006 | Bhattacharyya |
| 2006/0140012 A1 | 6/2006 | Wan et al. |
| 2006/0155921 A1 | 7/2006 | Gorobets et al. |
| 2007/0045711 A1* | 3/2007 | Bhattacharyya ...... H01L 29/792 257/E21.21 |
| 2007/0134876 A1 | 6/2007 | Lai et al. |
| 2008/0054346 A1* | 3/2008 | Saitoh .................. H01L 27/115 257/E21.679 |
| 2008/0173930 A1* | 7/2008 | Watanabe ......... H01L 27/11568 257/E21.21 |
| 2008/0178794 A1* | 7/2008 | Cho ...................... C23C 16/345 117/103 |
| 2008/0239812 A1 | 10/2008 | Naofumi et al. |
| 2008/0301359 A1 | 12/2008 | Smith |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0242966 A1 | 10/2009 | Son et al. |
| 2009/0268519 A1 | 10/2009 | Ishii |
| 2009/0279360 A1 | 11/2009 | Peter et al. |
| 2009/0316487 A1 | 12/2009 | Lee et al. |
| 2010/0013001 A1* | 1/2010 | Cho ...................... B82Y 10/00 977/773 |
| 2010/0124116 A1 | 5/2010 | Takashi et al. |
| 2010/0128509 A1 | 5/2010 | Kim et al. |
| 2010/0213527 A1 | 8/2010 | Shim et al. |
| 2011/0044113 A1 | 2/2011 | Kim |
| 2011/0115011 A1 | 5/2011 | Masuoka et al. |
| 2011/0208905 A1 | 8/2011 | Shaeffer et al. |
| 2011/0291176 A1 | 12/2011 | Lee et al. |
| 2011/0298013 A1 | 12/2011 | Hwang et al. |
| 2012/0182801 A1 | 7/2012 | Lue |
| 2012/0243314 A1 | 9/2012 | Takashi |
| 2012/0307568 A1 | 12/2012 | Banna et al. |
| 2013/0031325 A1 | 1/2013 | Nakamoto et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0117366 A1 | 5/2014 | Saitoh |
| 2014/0151774 A1 | 6/2014 | Rhie |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0249143 A1 | 9/2015 | Sano |
| 2015/0372099 A1 | 12/2015 | Chen et al. |
| 2016/0019951 A1 | 1/2016 | Park et al. |
| 2016/0086970 A1 | 3/2016 | Peng |
| 2016/0225860 A1 | 8/2016 | Karda et al. |
| 2016/0300724 A1 | 10/2016 | Levy et al. |
| 2016/0314042 A1 | 10/2016 | Plants |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0358594 A1 | 12/2017 | Lu et al. |
| 2018/0108416 A1 | 4/2018 | Harari |
| 2018/0269229 A1 | 9/2018 | Or-Bach et al. |
| 2018/0331042 A1 | 11/2018 | Manusharow et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0067327 A1 | 2/2019 | Herner et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0244971 A1 | 8/2019 | Harari |
| 2019/0259769 A1 | 8/2019 | Karda et al. |
| 2019/0325964 A1 | 10/2019 | Harari |

(56) References Cited

U.S. PATENT DOCUMENTS

| | | |
|---|---|---|
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0258897 A1 | 8/2020 | Yan et al. |

FOREIGN PATENT DOCUMENTS

| | | |
|---|---|---|
| JP | 2009206451 A1 | 9/2009 |
| JP | 2010108522 A1 | 5/2010 |
| JP | 2010251572 A | 11/2010 |
| JP | 2011028540 A1 | 2/2011 |
| KR | 20120085591 A | 8/2012 |
| KR | 20120085591 A1 | 8/2012 |
| KR | 20120085603 A | 8/2012 |
| WO | 2018236937 A1 | 12/2018 |

OTHER PUBLICATIONS

"EP Extended Search Report EP168690149.3", dated Oct. 18, 2019.
"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", Mar. 20, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 GB 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.

\* cited by examiner

CHARGE-TRAPPING LAYER WITH OPTIMIZED NUMBER OF CHARGE-TRAPPING SITES FOR FAST PROGRAM AND ERASE OF A MEMORY CELL IN A 3-DIMENSIONAL NOR MEMORY STRING ARRAY

CROSS REFERENCE TO RELATED APPLICATIONS

This application is related to and claims priority of U.S. provisional application application no. 63/007,244, filed on Apr. 8, 2020. The priority of this application is expressly claimed, and the disclosure is hereby incorporated by reference in their entirety.

The present application is related to U.S. patent application ("Related Application"), Ser. No. 16/744,067, entitled "Implementing Logic Function And Generating Analog Signals Using NOR Memory Strings," filed on Jan. 15, 2020, which is a continuation-in-part application of U.S. non-provisional patent application Ser. No. 16/582,996 ("Non-provisional Application I"), entitled "Memory Circuit, System and Method for Rapid Retrieval of Data Sets," filed on Sep. 25, 2019, which is a continuation application of U.S. non-provisional patent application ("Non-Provisional Application II"), Ser. No. 16/107,306, entitled "System Controller and Method for Determining the Location of the Most Current Data File Stored on a Plurality of Memory Circuit," filed on Aug. 21, 2018, which is a divisional application of U.S. non-provisional patent application ("Non-provisional Application III"), Ser. No. 15/248,420, entitled "Capacitive-Coupled Non-Volatile Thin-Film Transistor Strings in Three Dimensional Arrays," filed on Aug. 26, 2016, which is related to and claims priority of (i) U.S. provisional application ("Provisional Application I"), Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application ("Provisional Application II"), Ser. No. 62/260,137, entitled "Three-dimensional Vertical NOR Flash Thin-film Transistor Strings," filed on Nov. 25, 2015; (iii) U.S. non-provisional patent application ("Non-Provisional Application IV"), Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application ("Provisional Application III"), Ser. No. 62/363,189, entitled "Capacitive Coupled Non-Volatile Thin-film Transistor Strings," filed Jul. 15, 2016. The disclosure of the Related Application is hereby incorporated by reference in its entirety.

BACKGROUND OF THE INVENTION

1. Field of the Invention

The present invention relates to charge-trapping layers in memory devices, such as non-volatile memory devices. In particular, the present invention relates to a charge-trapping layer of a memory cell in a Not-OR (NOR) memory string.

2. Discussion of the Related Art

In conventional NOR-type and NAND-type memory devices, an applied electrical field across a charge-trapping layer adds or removes charge from traps in the charge-trapping layer. FIG. 1 shows a schematic cross-section of vertical-channel, polycrystalline thin-film transistor or memory cell 100 with source region 10, drain region 20, channel region 30, tunnel oxide layer 40, charge-trapping layer 50, blocking oxide layer 60, and gate conductor 70. Charge-trapping layer 50 may be, for example, silicon nitride. A current is induced to flow from source region 10 through channel region 30 to drain region 20, when a suitable high voltage—relative to the voltage at source region 10—is placed on gate conductor 70. At the same time, electrons are drawn from channel region 30 into charge-trapping layer 50, where their accumulation shifts threshold voltage $V_t$ of memory cell 100 to a higher value. The higher value in threshold voltage $V_t$ of memory cell 100 represents a "programmed" state. By placing a high voltage of the opposite polarity on gate conductor 70, electrons are withdrawn from charge-trapping layer 70, so that threshold voltage $V_t$ of memory cell 100 is shifted to a lower value, which represents an "erased" state.

Fast program and erase of a memory cell are very desirable. Generally, a greater magnitude in the voltage placed on the gate conductor to effectuate programming or erase of a memory cell shortens the program or erase time, as illustrated in FIG. 2. As shown in FIG. 2, waveform 201a represents the program times for shifting threshold voltage $V_t$ from approximately 1.0 volts to a voltage between 1.0 volts and 6.0 volts using a program voltage of 12 volts. Waveform 201b represents the erase times for shifting threshold voltage $V_t$ from approximately 6.0 volts to a voltage between 1.0 volts and 6.0 volts using an erase voltage of −12.0 volts. Likewise, waveforms 202a and 203a represent the program times for shifting threshold voltage $V_t$ from approximately 1.0 volts to a voltage between 1.0 volts and 6.0 volts using programming voltages of 10.0 volts and 8.0 volts, respectively. Waveforms 202b and 203b represent the erase times for shifting threshold voltage $V_t$ from approximately 6.0 volts to a voltage between 1.0 volts and 6.0 volts using erase voltages of −10.0 volts and −8.0 volts, respectively.

However, a higher voltage at the gate conductor decreases the charge-trapping layer's endurance. Endurance is the ability of the memory cell to maintain substantially the same "programmed" or "erased" state threshold voltage $V_t$ after many program and erase cycles FIG. 3 shows a collection of waveforms each representing threshold voltage $V_t$ of a memory cell after predetermined number of program and erase operations using a predetermined program or erase voltage over $10^8$ programming and erase cycles. For example, waveform 301a represents threshold voltage $V_t$—initially about 1.3 volts—after 10, $10^2$, . . . , $10^8$ program and erase cycles, using a program voltage of 9.5 volts. Likewise, waveform 301b represents threshold voltage $V_t$—initially about 0.0 volts—after 10, $10^2$, . . . , $10^8$ program and erase cycles, using a program voltage of −9.5 volts. The memory cell in each waveform in FIG. 3 is a thin-film storage transistor with a 1.2-nm tunnel oxide (e.g., $SiO_2$), a 8.5-nm charge-trapping layer (e.g., SiN with a refractive index of 2.20), and a 3.0-nm blocking oxide layer (e.g., $SiO_2$). Each program and erase operation is achieved using a 1.0-microsecond pulse at the specified program or erase voltage.

In FIG. 3, waveform 301a indicates that the "programmed" state threshold voltage $V_t$ of the memory cell has shifted to about 3.0 volts after $10^8$ program and erase cycles, and the corresponding "erased" state threshold voltage $V_t$ has also moved up to about 2.7 volts over the same time period. These shifts in threshold voltages are believed to be caused by trap sites created in the tunnel oxide layer as a result of the tunneling currents over a long period of programming and erase cycles. The electrons trapped in trap sites in the tunnel oxide layer are not removed in an erase operation on the charge-trapping layer. FIG. 3 therefore illustrates degradation in the memory cell's endurance, as evidenced by the shifts in the "programmed" and "erased" state threshold voltages at higher program and erased voltages as the number of program and erase cycles increase. Thus, there is a trade-off in endurance between fast program and erase times and the magnitude of program and erase voltages at the gate conductor. With the high density of memory cells in a state-of-the-art memory circuit, the threshold voltages of the memory cells are not uniform, resulting in a distribution in threshold voltages amongst the memory cells. FIG. 4 shows a distribution of memory cells in "programmed" and "erased" states in one memory system. As shown in FIG. 4, memory cells having a threshold voltage less than 2.0 volts (i.e., region 401a), with a mean threshold voltage at about 1.5 volts, are deemed in the "erased" state; and memory cells having a threshold voltage greater than 5.0 volts (i.e., region 401b), with a mean threshold voltage at about 5.5 volts, are deemed in the "programmed" state. The difference in threshold voltages between memory cells arises primarily from a difference in the number of electrons stored in their charge-trapping layers. A greater number of electrons results in a higher threshold voltage.

To allow a determination of whether a given memory cell is in the "programmed" state or in the "erased" state, the memory system requires a minimum difference in threshold voltage $V_t$ ($\Delta V_t$) between the memory cells in the "programmed" state and the memory cells in the "erased" state. It is also desirable to minimize variations in threshold voltage within each population (i.e., "programmed" state population or the "erased" state population). For example, suppose the highest threshold voltage $V_t$ among memory cells in the "erased" state is $V_e$ and the lowest threshold voltage $V_t$ among memory cells in the "programmed" state is $V_p$, a memory cell having threshold voltage $V_{t1} < V_e$ requires a higher program voltage or a longer programming pulse to program the memory cell to threshold voltage $V_p$ than a memory cell with a threshold voltage $V_e$ in the erased state. Similarly, a memory cell with a threshold voltage $V_{t2} > V_p$ in the "programmed" state requires a higher voltage (in magnitude) or a longer erase pulse to erase the memory cell to threshold voltage $V_e$. In either case, using a minimal program or erase pulse may not succeed in programming or erasing any given memory cell to threshold voltage $V_p$ or $V_e$, respectively. To ensure a high probability of success in the programming or erase operation using only one program or erase pulse, one must resort to using a high (in magnitude) program or erase voltage. The resulting distributions of threshold voltages of memory cells in the "programmed" or "erased" states, however, will become wider. In general, many more charge-trapping sites are available in the charge-trapping layer of a memory cell than the electrons needed to shift the threshold voltage of the memory cell by $\Delta V_t$, which contributes to a wider distribution in either "programmed" or "erased" state.

In the prior art, a method to reduce the spread of the distributions for memory cells in the "programmed" or "erased" state is to "read" the memory cell at a low voltage (in magnitude) to verify that the cell has achieved the desired "programmed" or "erased" state, and to repeat the programming or erase operation until the desired "programmed" or "erase" state is achieved. This iterative procedure is referred to as a "read-verify" procedure. It is not uncommon to program or erase the memory cell many times during the read-verify procedure to achieve the desired state. While the read-verify procedure is effective in achieving distributions of reduced widths using lower (in magnitude) program or erase voltage, overall program and erase times are increased because of the inevitable repetitive program and erase steps.

SUMMARY

The present invention provides an optimized charge-trapping layer in a memory device which allows a memory system incorporating such memory devices to have reduced programming and erase times. The optimized charge-trapping layer may be applicable, for example, to memory cells in a 3-dimensional array of non-volatile NOR-type memory strings. The parameters to be optimized include, for example, the number of charge-trapping sites in the charge-trapping layer, and its physical dimensions (e.g., length, width, and thickness). Furthermore, the electric field across the tunnel oxide layer during the programming or erase operational for the optimized charge-trapping layer is significantly lower than under a conventional programming or erase operation, such that the endurance of the memory device is significantly enhanced.

According to one embodiment of the present invention, a thin-film memory transistor may include a source region, a drain region, a channel region, a gate electrode, and a charge-trapping layer provided between the channel region and the gate electrode and electrically isolated therefrom, wherein the charge-trapping layer has includes a number of charge-trapping sites that is 70% occupied or evacuated using a single voltage pulse of a predetermined width of 500 nanoseconds or less and a magnitude of 15.0 volts or less. The charge-trapping layer comprises silicon-rich nitride may have a refractive index of 2.05 or greater or comprises nano-crystals of germanium (Ge), zirconium oxide ($ZrO_2$), or zinc oxide (ZnO). The thin-film memory transistor may be implemented, for example, in a 3-dimensional array of NOR memory strings formed above a planar surface of a semiconductor substrate.

The present invention is better understood upon consideration of the detailed description below in conjunction with the accompanying drawings.

BRIEF DESCRIPTION OF THE DRAWINGS

To facilitate cross-references among the figures, like elements in the figures are assigned like reference numerals.

DETAILED DESCRIPTION OF THE PREFERRED EMBODIMENTS

In this detailed description, process steps described in one embodiment may be used in a different embodiment, even if those steps are not described in the different embodiment. When reference is made herein to a method having two or more defined steps, the defined steps can be carried out in any order or simultaneously (except where context or specific instruction excludes that possibility), and the method can include one or more other steps carried out before any of the defined steps, between two of the defined steps, or after all the defined steps (except where context excludes that possibility).

Figure 1:
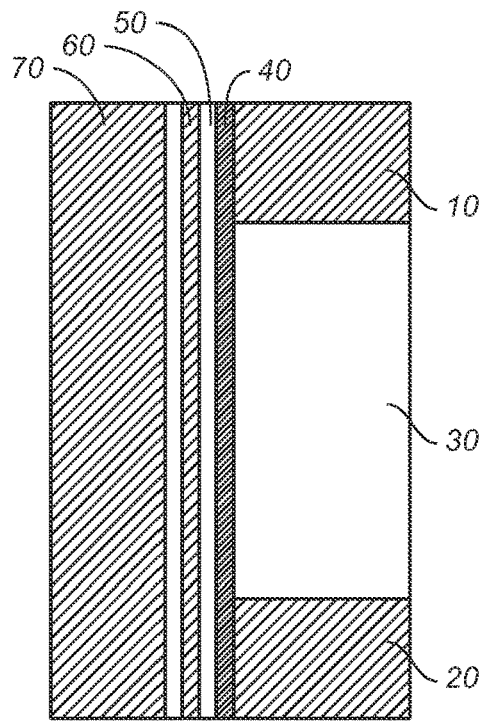
FIG. 1 shows a schematic cross-section of vertical-channel, polycrystalline thin-film transistor or memory cell 100 with source region 10, drain region 20, channel region 30, tunnel oxide layer 40, charge-trapping layer 50, blocking oxide layer 60, and gate conductor 70.
Figure 2:
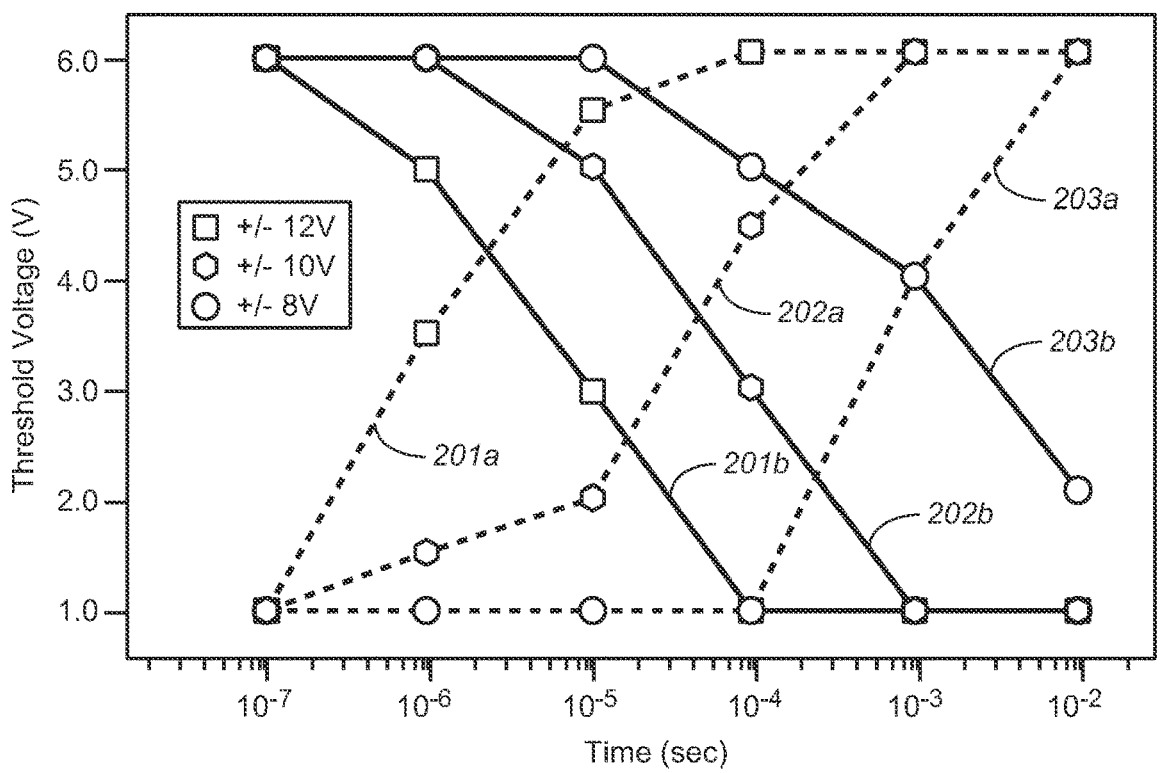
FIG. 2 demonstrates that a greater magnitude in the voltage placed on the gate conductor to effectuate programming or erase of a memory cell shortens the program or erase time.
Figure 3:
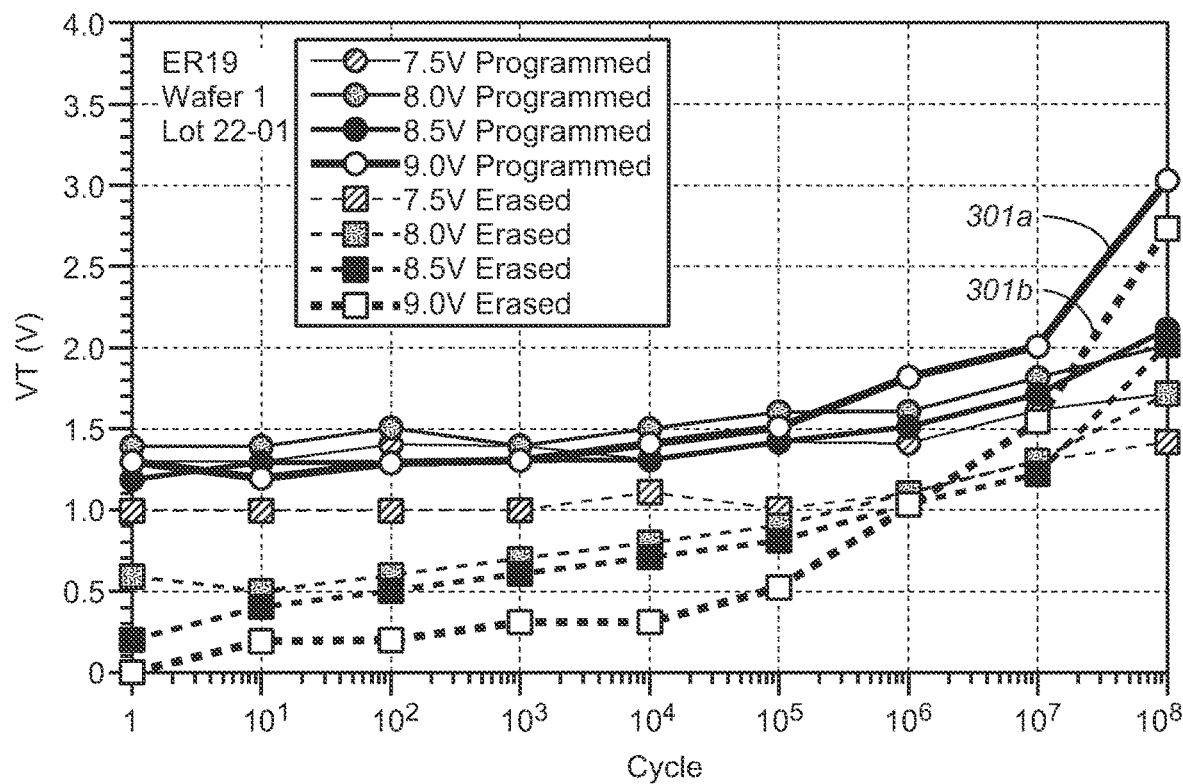
FIG. 3 shows a collection of waveforms each representing threshold voltage $V_t$ of a memory cell after predetermined number of program and erase operations using a predetermined program or erase voltage over $10^8$ programming and erase cycles.
Figure 4:
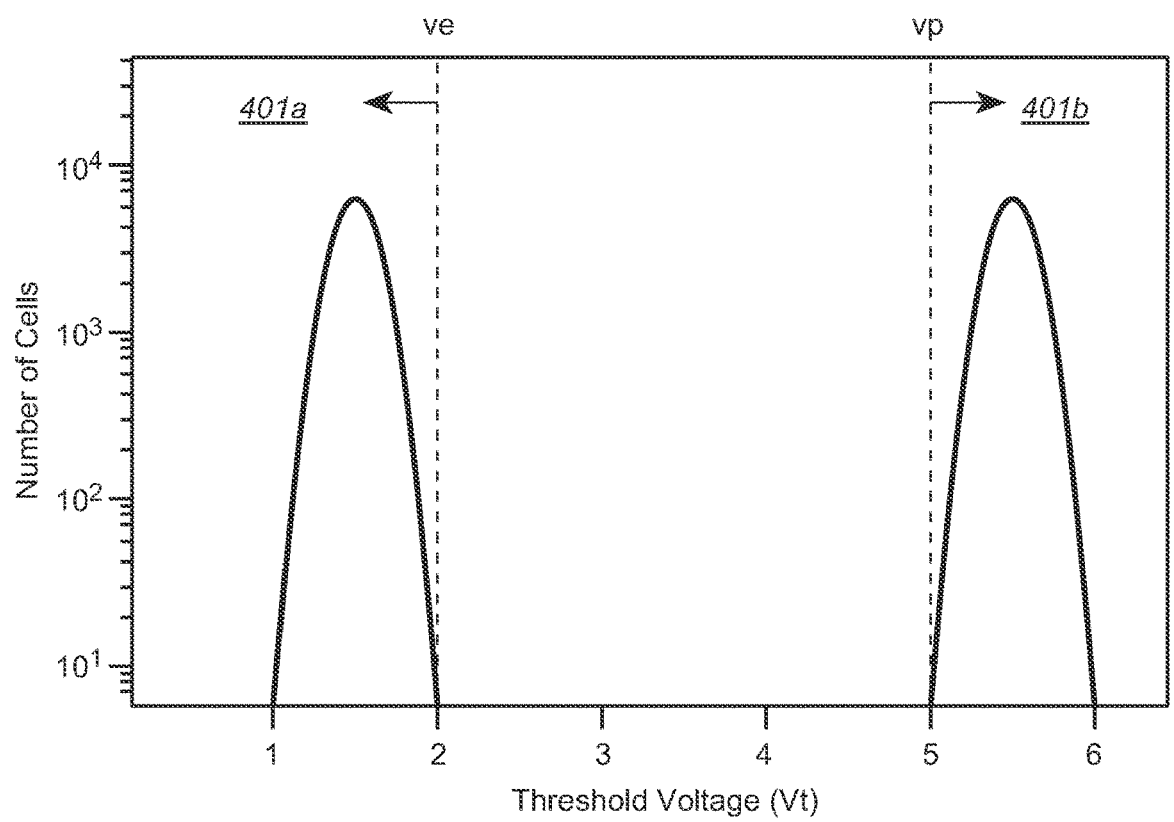
FIG. 4 shows a distribution of memory cells in "programmed" and "erased" states in one memory system.
Figure 5:
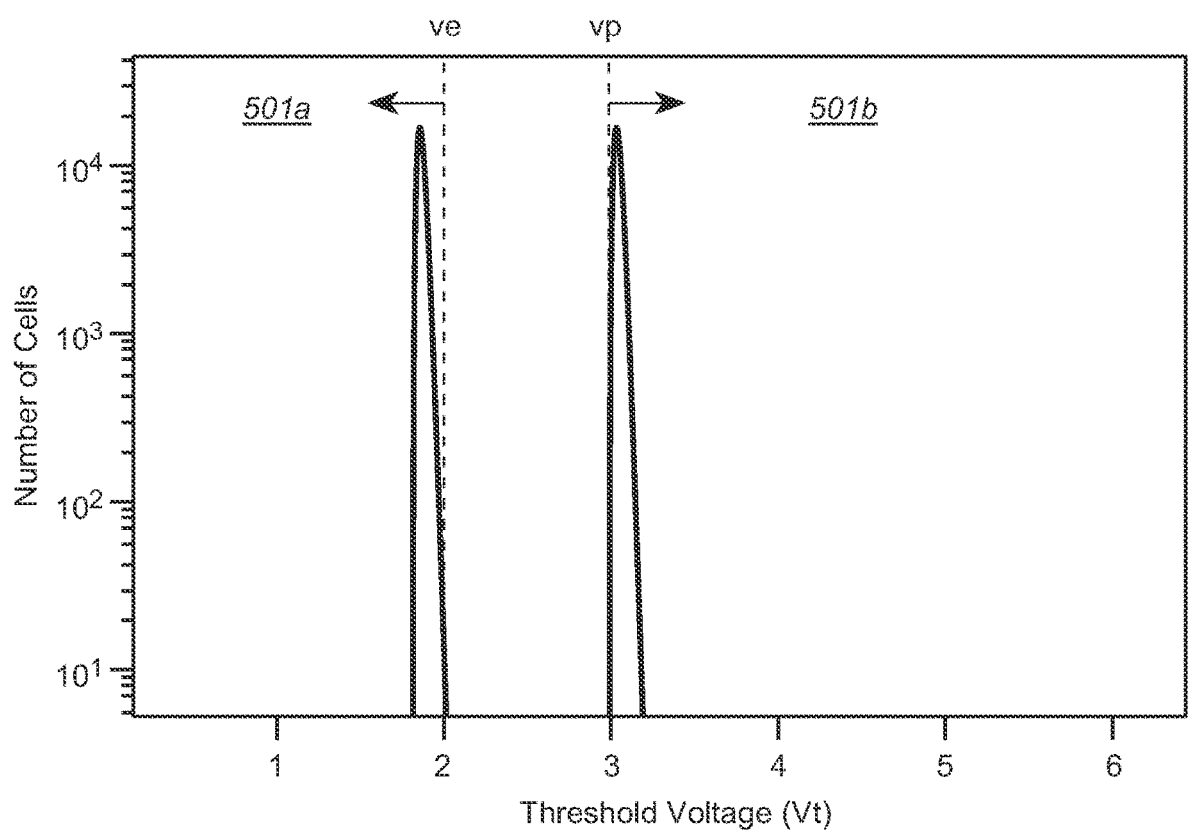
FIG. 5 shows narrow distributions of threshold voltages in memory cells that are in the "programmed" and "erased" states, achieved by limiting the number of charge-trapping sites in their charge-trapping layers.

According to one embodiment of the present invention, the distribution of threshold voltages of memory cells in a "programmed" or an "erased" state may be reduced by limiting the available number of charge-trapping sites needed to obtain a threshold voltage difference of $\Delta V_t$ between memory cells of the "programmed" and "erased" states. FIG. 5 shows narrow distributions of threshold voltages in memory cells that are in the "programmed" (i.e., region 501b) and "erased" (i.e., region 501a) states, achieved by limiting the number of charge-trapping sites in their charge-trapping layers. When the number of charge-trapping sites is so small, such that a program pulse supplies sufficient electrons to completely or nearly completely fill the available charge-trapping sites (e.g., greater than 70% filled), the read-verify procedure is obviated for the program operation. Likewise, when the number of charge-trapping sites is so small, such that an erase pulse removes sufficient electrons to completely or nearly completely vacate the available charge-trapping sites, the read-verify procedure is obviated for the erase operation (e.g., greater than 70% evacuated). By eliminating the read-verify procedure, program and erase times for the memory system are much reduced.

Another method to narrow the distributions of threshold voltages in the memory cells in the "programmed" or the "erased" state is to reduce difference $\Delta V_t$ in the threshold voltages between the "programmed" state and the "erased" state in the memory cell. The widths of the distributions of memory cells in the "programmed" and the "erased" states are dependent, in part, on the value of threshold voltage difference $\Delta V_t$. A larger threshold voltage difference $\Delta V_t$ results in wider distributions in memory cells in the "programmed" and the "erased" states. For example, the distributions of memory cells in the "programmed" and the "erased" states are narrower when highest voltage $V_e$ for the "erased" state and lowest threshold voltage $V_p$ for the "programmed" state are set at 1.0 volts and 2.0 volts (i.e., $\Delta V_t$ equals 1.0 volts), respectively, than when they are set at 2.0 volts and 6.0 volts (i.e., $\Delta V_t$ equals 1.0 volts).

The present invention provides numerous ways for providing a charge-trapping layer with an optimal number of charge-trapping sites. For example, to achieve a 1.0-volt threshold difference $\Delta V_t$ for a polysilicon thin-film transistor, a total electron area, density of $2.7\times10^{12}$ e−/cm² is required of the charge-trapping layer. The trap-site density for silicon-rich silicon nitride (SRN) with an refractive index of 2.20, for example, has been reported to be $2.5\times10^{19}$ e−/cm³. (See, e.g., the article "Electron trap density distribution of Si-rich silicon nitride extracted using the modified negative charge density decay model of silicon-oxide-nitride-oxide-silicon structure at elevated temperature," by T. H. Kim, et al., *Applied Physics Letters* 89, 063508-063511 (2006).) Therefore, for a 1.0 nm thick SRN charge-trapping layer, the trap-site area density is $2.5\times10^{19}$ e−/cm³$\times1.0\times10^{-7}$ cm) or $2.5\times10^{12}$ e−/cm². For reference, a 1.0 nm thick SRN film is a much thinner charge-trapping layer than those used in current state-of-the-art SRN films used in multi-level (MLC) NAND memory devices; such SRN films in MLC NAND devices are typically 7.0 nm or more thick. MLC NAND devices typically have multiple "programmed" and "erased" states, and require the read-verify procedure to attain any of the multiple "programmed" and "erased" states. The program and erase times of MLC NAND devices are therefore notoriously long (e.g., tens to hundreds of microseconds).

In one embodiment, a memory cell in a NOR memory string—which is configured in the manner disclosed in the Related Application, incorporated by reference above—has a 1.0 nm thick SRN charge-trapping layer provided between a 1.0 nm thick tunneling oxide layer and a 1.0 nm thick blocking oxide layer. The Related Application teaches forming arrays of such NOR memory strings in a 3-dimensional memory structure above a planar surface of a semiconductor substrate. It is desired to program or erase the memory cell using a single pulse of 500 ns or less wide to effectuate threshold voltage difference $\Delta V_t$ of 1.0 volts between "programmed" or "erased" states. In that memory cell the dominant program or erase mechanism is believed direct tunneling. Under such conditions, the magnitude of the required program or erased voltage to program or erase such a memory cell using a single pulse of 500 ns wide or narrower, preferably 100 ns or narrower, may be empirically determined, but estimated to be about 8.0-15.0 volts.

According to another embodiment of the present invention, one method to achieve a advantageously small number of trap-sites in a charge-trapping layer of a memory cell is to reduce the trap-site density in the material of the charge-trapping layer (e.g., SRN). The trap-site density in SRN is dependent in part, for example, on its composition. SRN films may vary in refractive index between about 2.0 and about 2.4, for example, between (See, e.g., the article "Explanation of the charge-trapping properties of silicon nitride storage layers for NVM devices Part I: Experimental evidences from physical and electrical characterization," by E. Vianello, et al., *IEEE Transactions on Electron Devices* 58, no. 8, pp. 2483-2489 (2011).) When the trap-site density is reduced to less than $2.5\times10^{19}$ e−/cm³, a SRN charge-trapping layer that is greater than 1.0 nm thick may be used to achieve the 1.0-volt threshold difference $\Delta V_t$, discussed above.

Alternatively, a charge-trapping layer with desirably small number of trap sites may be achieved using nanocrystals (also known as quantum dots) in the charge-trapping layer; suitable materials that contain nano-crystal include, for example, various charge-transporting layers (CTLs) used in many electronic devices. (See, e.g., the articles (i) "Charge-trap memory device fabrication by oxidation of $Si_{1-x}Ge_x$," by Y.-C. King et al., *IEEE Transactions on Electron Devices* 48, no. 4, pp. 696-800 (2001); and (ii) "Nanoislands-based charge trapping memory: A scalability study," by N. El-Atab, et al., *IEEE Transactions on Nanotechnology* 16, no. 6, pp. 1143-1145 (2017).) Nanocrystals of germanium (Ge), zirconium oxide ($ZrO_2$), or zinc oxide (ZnO), or any suitable material, can be fabricated in a manner to control the area density in the resulting material, thereby allowing a good control of the trap-site area density.

As the electric field across the tunnel oxide layer during the programming or erase operational for a charge-trapping layer of the present invention is significantly lower than under a conventional programming or erase operation, the endurance of the memory device is significantly enhanced.

The above detailed description is provided to illustrate specific embodiments of the present invention and is not intended to be limiting. Numerous modifications and variations within the scope of the present invention are possible. The present invention is set forth in the following claims.

We claim:

1. A thin-film memory transistor, comprising a source region, a drain region, a channel region, a gate electrode, and a charge-trapping layer provided for charge storage between the channel region and the gate electrode and electrically isolated therefrom, wherein the charge-trapping layer comprises a silicon-rich nitride, with a thickness that is less than 1.0 nm and a trap-site area density of less than $2.7 \times 10^{12}$ electrons per $cm^2$.

2. The thin-film memory transistor of claim 1, wherein the charge-trapping sites are greater than 70% occupied or evacuated using a single voltage pulse of a predetermined width of 500 nanoseconds or less and a magnitude of 15.0 volts or less.

3. The thin-film memory transistor of claim 2, wherein the magnitude of the voltage pulse is between 8.0-15.0 volts.

4. The thin-film memory transistor of claim 2, wherein the single voltage pulse changes the threshold voltage of the thin-film memory transistor by 1.0-4.0 volts.

5. The thin-film memory transistor of claim 1, wherein the silicon-rich nitride has a refractive index of 2.05 or greater.

6. The thin-film memory transistor of claim 1, wherein the thin-film memory transistor is provided in a NOR memory string.

7. The thin-film memory transistor of claim 6, wherein the NOR memory string is one of a plurality of NOR memory strings arranged in a memory structure formed above a semiconductor substrate.

8. The thin-film memory transistor of claim 2, wherein the predetermined width is less than 100 nanoseconds.

* * * * *